United States Patent [19]

Brogardh et al.

[11] Patent Number: 4,529,875
[45] Date of Patent: Jul. 16, 1985

[54] FIBER-OPTICAL MEASURING APPARATUS

[75] Inventors: Torgny Brogardh, Västerås; Christer Ovren, Västerås, both of Sweden

[73] Assignee: ASEA Aktiebolag, Västerås, Sweden

[21] Appl. No.: 417,518

[22] Filed: Sep. 13, 1982

[30] Foreign Application Priority Data

Sep. 15, 1981 [SE] Sweden .............................. 8105473

[51] Int. Cl.³ .............................................. G02B 5/14
[52] U.S. Cl. .................................. 250/227; 250/231 R; 324/96
[58] Field of Search ................... 250/227, 231 R, 226; 350/374, 375, 376, 377, 408, 356; 324/96, 350

[56] References Cited

U.S. PATENT DOCUMENTS

| | | | |
|---|---|---|---|
| 3,502,978 | 3/1970 | Bernard | 324/96 |
| 4,249,076 | 2/1981 | Bergstrom | 250/227 |
| 4,255,018 | 3/1981 | Ulrich | 324/96 |
| 4,275,296 | 6/1981 | Adolfsson | 250/227 |
| 4,309,084 | 1/1982 | Hill | 350/377 |

Primary Examiner—David C. Nelms
Assistant Examiner—Jim Gatto
Attorney, Agent, or Firm—Watson, Cole, Grindle & Watson

[57] ABSTRACT

A fiber-optical measuring apparatus for measuring magnetic fields, current, position, and various mechanical quantities consists of a transducer connected to a measuring electronic unit via at least one optical fiber, and the transducer comprises a magneto-optical modulator with a domain-producing magnetic material. The transducer is provided with at least two optical filters, of which at least one filter is positioned in the ray path on one side of the magneto-optical modulator and at least one other filter is positioned in the ray path on the opposite side of the modulator.

18 Claims, 13 Drawing Figures

FIBER-OPTICAL MEASURING APPARATUS

TECHNICAL FIELD

This invention relates to a fiber-optical measuring apparatus of the kind comprising a transducer connected to a measuring electronic unit via at least one optical fiber, the transducer comprising a magneto-optical modulator with a domain-producing magnetic material. Such measuring apparatus may be used for measuring magnetic fields, electric currents and various mechanical quantities.

BACKGROUND ART

It is known in this field, to manipulate magnetic domains and optically sense these domains (see, for example, the outline article "Magnetic Bubbles—an Emerging New Memory Technology", A. H. Bobeck et al, Proceedings of the IEEE, Vol. 63, No. 8, August 1975, and "Domain Behavior in Some Transparent Magnetic Oxides", R. C. Sherwood et al, Journal of Applied Physics, Vol. 30, No. 2, February 1959). Further, it is known to measure magnetic fields by means of optical fibers (see, for example, T. Brogaardh et al's U.S. patent application Ser. No. 152,724 filed on May 23rd, 1980 and assigned with the present application to a common assignee). However, none of the techniques mentioned above is capable of measuring small magnetic field strengths with high accuracy by means of optical fibers.

A primary object of the present invention is to provide a fiber-optical measuring apparatus of the kind referred to, by means of which very samll changes in a magnetic domain picture can be sensed with high reproducibility by means of the optical fiber.

DISCLOSURE OF THE INVENTION

According to the invention, in a fiber-optical measuring apparatus comprising a transducer connected to a measuring electronic unit via at least one optical fiber, the transducer comprising a magneto-optical modulator with a domain-producing magnetic material, said transducer is provided with at least two optical filters, of which at least one filter is located in the ray path on one side of said magneto-optical modulator and at least one other filter is located in the ray path on the opposite side of said modulator, said measuring electronic unit comprises at least three light sources having different emission spectra which are so chosen with respect to the filters in the transducer that the light from one of said light sources is absorbed in said transducer to a greater extent than the light from the other light sources, that the light from said other light sources is reflected from said transducer, but that said magneto-optical modulator modulates the light from one of the last-mentioned light sources to a greater extent than it modulates the light from the other light sources, and said measuring electronic unit comprises a calculating unit for calculating, from a signal from a detector which is optically coupled to said at least one optical fiber, the magneto-optical degree of modulation with compensation for varying attenuation and reflection in the fiber optic system of the apparatus.

BRIEF DESCRIPTION OF THE DRAWINGS

The invention will now be described, by way of example, with reference to the accompanying drawings, in which.

DESCRIPTION OF PREFERRED EMBODIMENTS

Figure 1:
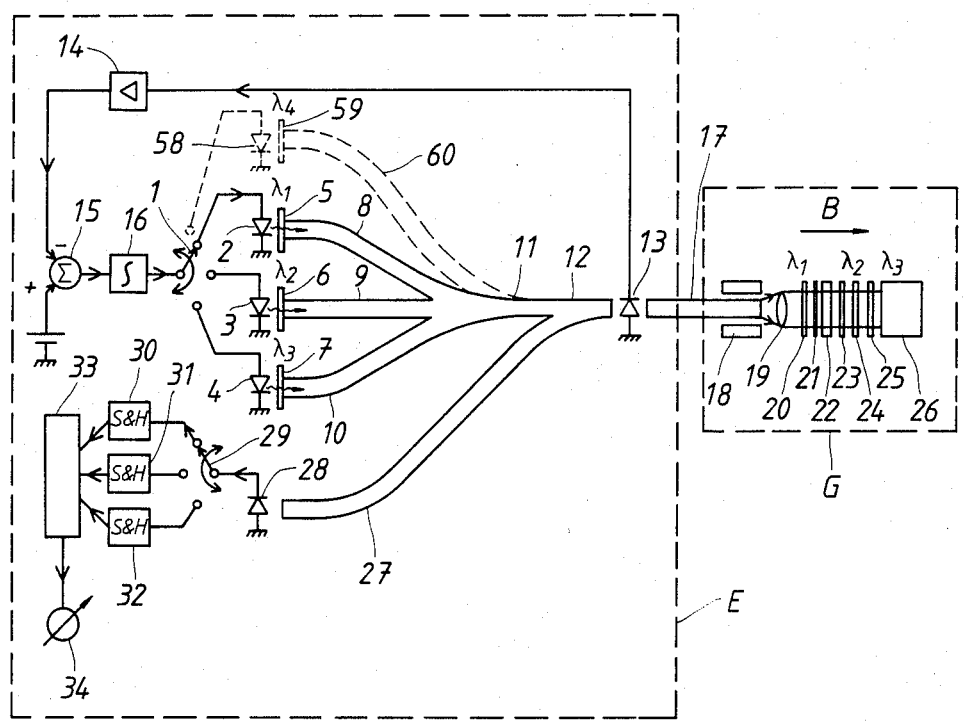
FIG. 1 is a schematic diagram of one embodiment of fiber-optical measuring apparatus in accordance with the invention for measuring magnetic fields.

FIG. 1 shows a fiber-optical measuring apparatus for measuring a magnetic field B. In this apparatus a switch 1 switches in, in successive order, light sources 2, 3, 4, which emit light to optical fibers 8, 9 and 10, respectively, in bands having center wavelengths $\lambda_1$, $\lambda_2$ and $\lambda_3$, respectively. The light sources 2, 3 and 4 may be light emitting diodes or laser diodes. In order that the emission spectra from the light sources 2, 3, 4 shall not overlap each other, an optical filter 5, 6 and 7, respectively, is arranged between each light source and the optical fiber 8, 9 and 10, respectively, to which light is emitted. Via optical fiber branches 11 and 12, the light is passed to a transparent photo-detector 13, the output signal of which is amplified by an amplifier 14 and, via a difference generator 15 and the regulator 16, is used for regulating the light intensity from the light sources 2, 3, 4. The light which passes through the transparent photo-detector 13, is conducted by an optical fiber 17 to a transducer which comprises a field concentrator 18, a lens 19, two interference filters 20 and 24, two polarizing layers 21 and 23, a magneto-optical material 22, a light absorber 25, and a permanent magnet 26. The light which is reflected back into the fiber 17 by the interference filters 20 and 24 is passed via the branch 12 and an optical fiber 27 to a photo-detector 28. The signal from the detector 28 is coupled by a switch 29 in the proper order to amplifier and sample-and-hold (S and H) circuits 30, 31 and 32 for storing the values of the light intensities which reach the photo-detector 28 when the light sources 2, 3 and 4, respectively, are switched in. The output signals from the S and H circuits 30–32 are supplied to a processor 33, which from these signals calculates the measured value, which is indicated by a measuring instrument 34.

Figure 2:
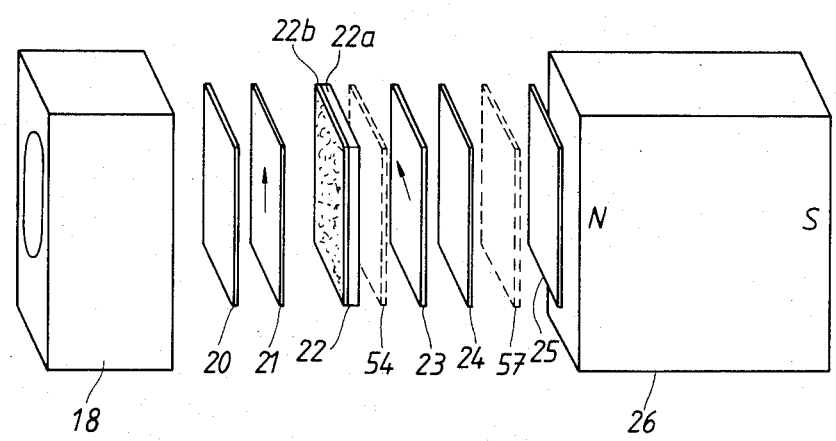
FIG. 2 is a schematic perspective view of the transducer of the apparatus of FIG. 1.

The components included in the transducer proper—with the exception of the lens—are shown in more detail in FIG. 2. The magneto-optical material consists of a substrate 22a with a thin film 22b of ferromagnetic material, which is chosen so that optical domains occur. One example of a class of such materials are the orthoferrites ($RFeO_3$), where R may be a rare earth type metal. A plurality of materials exist which are synthetized with properties to be magnetically anisotropic, so that the domain structures occur in thin layers. When selecting materials for transducer applications a large Faraday rotation is desired (e.g. $FeBO_3:4 \times 10^3$ degrees/cm at $\lambda = 0.5$ μm, $YIG:1.5 \times 10^3$ degrees/cm at $\lambda = 1.1$ μm, and $GdIG:100^3$ degrees/cm at $\lambda = 1.15$ μm) at the wavelengths normally occurring in connection with fiber optics, and it is also desired to have not too high a light absorption ($FeBO_3:100$ cm$^{-1}$ at $\lambda = 0.5$ μm and YIG:7 cm$^{-1}$ at $\lambda = 1.1$ μm). In order to obtain as small a temperature dependence as possible, the material should not have any absorption edge at the second wavelength interval, while at the same time the temperature dependence of the Faraday rotation should be minimal. Furthermore, the material should be chosen so that the temperature dependence as regards the size of the domains when an external field is applied is maintained at a low level. The resultant temperature dependence of the magneto-optical modulator can be compensated for by using a temperature-dependent bias magnetic field, which can be obtained, for example, with a temperature-dependent permanent magnet 26 made, for example, from the material Indox. To obtain a well defined field, perpendicular to the layer 22b, the field concentrator 18 is arranged on the fiber side of the transducer.

The polarizing layers 21 and 23 are used to detect the Faraday rotation, created by the domains in the layer 22b. These layers are rotated relative to each other in such a way that the polarization rotation, produced by one domain type (excited in one direction), provides a small light transmission, whereas the other domain type (excited in the opposite direction) provides a higher light transmission. Since one domain type grows at the expense of the other, because of a changed external magnetic field, the light transmission through the optical system consisting of the items 21, 22 and 23 will thus be changed.

Figure 3:
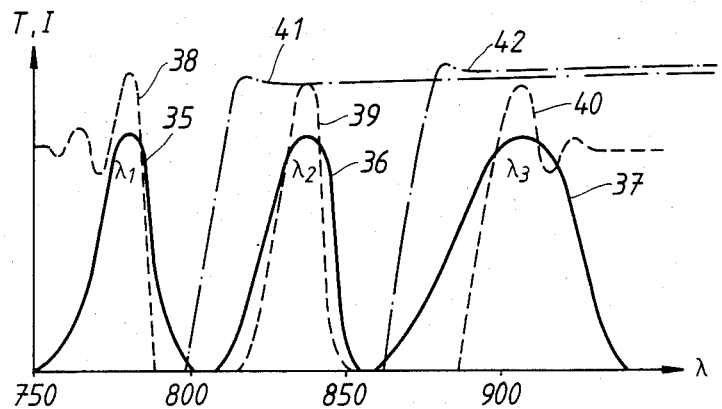
FIG. 3 is a graph showing spectral curves relating to the apparatus of FIG. 1.

To be able to detect these changes in the light transmission with a high degree of accuracy via the optical fiber 17, wavelength multiplexing is used, which is performed by the interference filters 20 and 24. The optical measuring technique behind this will now be described with the aid of the spectral curves in FIG. 3. The three light sources 2, 3 and 4 produce the emission spectra 35, 36 and 37, respectively. The filters 5, 6 and 7 with transmission spectra 38, 39 and 40, respectively, guarantee that the light which is introduced into the fiber optic in the different wavelength bands $\lambda_1$, $\lambda_2$, $\lambda_3$, does not have overlapping spectra. The transparent photodiode 13 guarantees that the light energy values at the different wavelength ranges are maintained at a constant relationship with respect to each other. The interference filter 20 in the transducer with the transmission curve 41 reflects the light in the wavelength band $\lambda_1$, which is used when compensating for varying fiber damping. The interference filter 24 in the transducer with the transmission curve 42 reflects the light in the wavelength band $\lambda_2$, which is used for calculating the light transmission through items 21, 22 and 23. The light which is transmitted through the interference filter 24 and lies in the wavelength band $\lambda_3$ is absorbed in the layer 25. Thus, in the wavelength band $\lambda_3$, the photodetector 28 receives only light which emanates from reflexes in the optic system. Thus, the light in the wavelength band $\lambda_3$ is used for compensating for varying reflexes.

Figure 4:
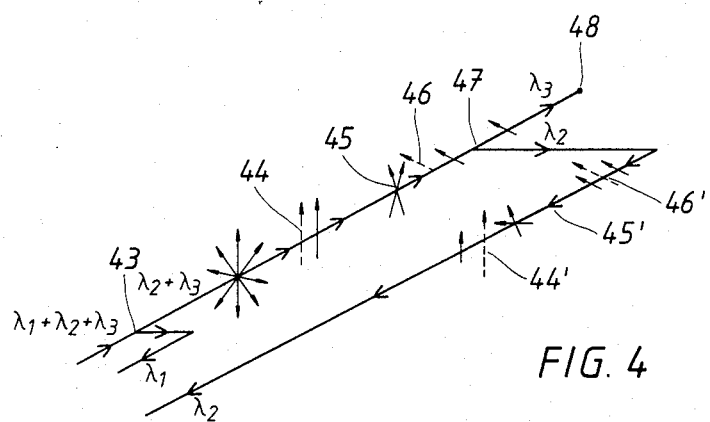
FIG. 4 is a diagram showing the light ray path in the transducer of the apparatus of FIG. 1, FIGS. 5 to 7 are graphs similar to FIG. 3 relating to modified forms of the apparatus of FIG. 1.

FIG. 4 summarizes the ray path in the transducer. Incoming light in the wavelength bands $\lambda_1$, $\lambda_2$ and $\lambda_3$ is divided by the interference filter 20 at the point 43 into a transmitted unpolarized signal in the wavelength bands $\lambda_2$ and $\lambda_3$ and a reflected signal in the wavelength band $\lambda_1$. In the polarizer 21 the light is linearly polarized (at 44), and in the modulator 22 the polarization plane is rotated in two directions (45) in dependence on the domain type that has been passed. When this light has passed the polarizer 23 (at 46), light with one polarization direction will be extinguished, and in the interference filter 24 (at 47) only a light component from the other polarization direction will therefore be reflected and again pass through 23 (46'), 22 (45') and 21 (44') to carry the measurement information to the detector 28. The light transmitted by the interference filter 24 (at 47) in the wavelength band $\lambda_3$ is absorbed by the detector 28 (at 48).

Figure 5:
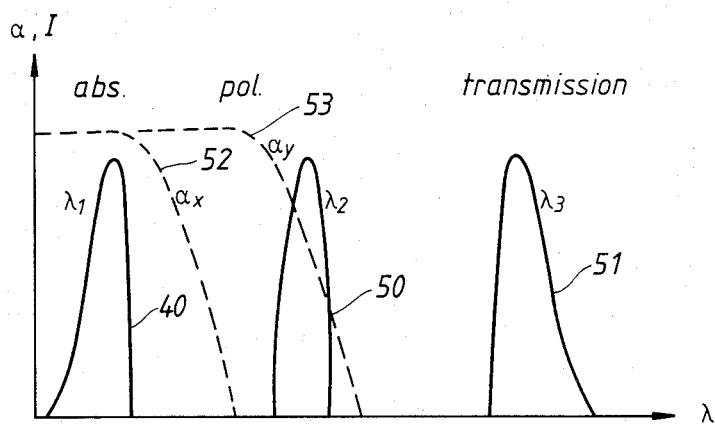

If the polarizing layers 21 and 23 are dichroic and if the absorber 25 is replaced by a reflector, the interference filters 20 and 24 may be omitted. This presupposes that a spectral characteristic according to FIG. 5 is used. In this Figure, the numerals 49, 50 and 51 designate spectra for the light arriving at the transducer. Numeral 52 designates the absorption spectrum for the polarizing layers 21 and 23 in one polarization direction x, and numeral 53 designates the absorption spectrum in another polarization direction y. According to FIG. 5, light of wavelength $\lambda_1$ will be absorbed (used for compensation of reflexes in the optic system), light of wavelength $\lambda_2$ will be polarized (used for measuring the domain state), and light of wavelength $\lambda_3$ will be transmitted. When the absorber 25 has been replaced by a reflector, light of wavelength $\lambda_2$ will thus be reflected back and be influenced by the polarization system twice, as described with reference to FIG. 4, whereas light of wavelength $\lambda_3$ will be reflected back uninfluenced and can thus be used for compensating for attenuation in the optic system.

Figure 6:
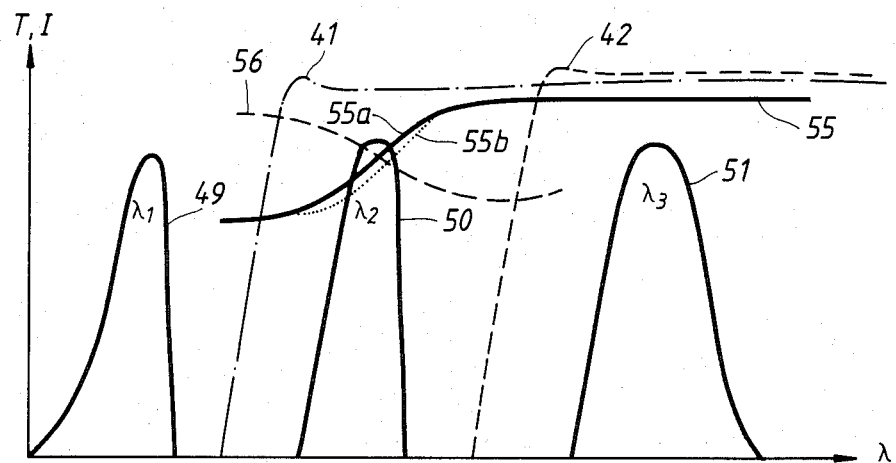

For compensating for the temperature dependence of the transducer, a temperature-sensitive filter 54 (see FIG. 2) may be introduced somewhere between the interference filters 20 and 24. FIG. 6 shows how the transmission characteristic 55 of this filter can be arranged in such a way that an absorption edge is obtained in the $\lambda_2$ wavelength band. An increase of the temperature will move the position of this absorption edge towards longer wavelengths (55a→55b), whereby the light of wavelength band $\lambda_2$ will be absorbed to a greater extent. This can be used directly for compensating a transmission which increases with the temperature because of the optic system 21, 22 and 23. If, instead, the system 21-23 acquires a transmission which decreases with the temperature, a filter having an absorption edge according to 56 can be used. The filters may be tailor-made with different temperature coefficients by a suitable choice of thickness and material for a given light characteristic 50.

Figure 7:
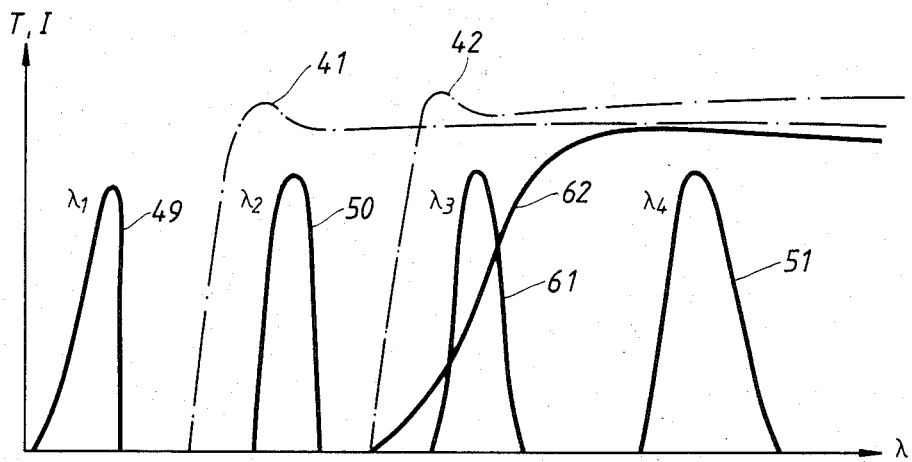

Instead of optically compensating for the effect of temperature on the transducer, this can be done electronically, in which case the transducer temperature must be measured. The simplest way of doing this is by introducing an additional light source 58 together with a filter 59 and a light conductor 60, as shown in dash lines in FIG. 1 and an additional optical filter 57 in the transducer proper, as shown in dash lines in FIG. 2. The spectral relationships for this system are shown in FIG. 7. The numeral 61 designates the spectral distribution of the light from the light source 58 after having passed through the filter 59 and the numeral 62 designates the transmission spectrum of the filter 57. When the transmission spectrum 62 is changed due to a temperature change, some intensity of light, dependent on the temperature, will be received in the wavelength band $\lambda_3$. The following parameters are then extracted in the processor 33: the attenuation of the fiber system, the reflections of the fiber system, the temperature of the transducer, and the magnitude of the magnetic field.

For detection of the optical domains, heretofore the Faraday effect in the magnetic material has been utilized. An alternative technique for domain detection is the posssibility of coating the surface of the layer 22b with a ferro-fluid, whereby the different magnetization directions of the domains will orient the magnetic particles in the ferro-fluid in such a way that a light attenuation which is dependent on the domain type and the domain walls is obtained in the ferro-fluid layer. For measuring these variations in attenuation, either unpolarized light or polarized light may be used, the polarizing layers 21 and 23, or only 23, thus becoming redundant.

The magnet 26 is not necessary if no temperature-matched off-set magnetic field is required, or if the properties of a special type of domains, such as bubbles, are not necessary. If magnetic bubble domains are to be utilized, a bias field is required which is greater than the field required for stripe domains to decompose into bubble domains, and smaller than the bubble collapse field. Since the bubble collapse field reduces with increased temperature, the offset field from the magnet 26 must also be reduced with increased temperature, which can be achieved by a suitable choice of material for the permanent magnet (Indox). Some of the advantages of operating with domains of bubble type are reduced hysteresis and greater relative transmission changes. If the polarizing layer 21 and 23 are rotated so that all the light through the parts of the magnetic thin film 22b, which are not bubbles, is extinguished, the optical signal after the polarizing layer 23 will be proportional to $D^2 \sin^2 \theta$, where D is the diameter of the bubbles and $\theta$ is the angle between the polarization direction of the light which has passed the bubbles and the polarization direction of the layer 23. For example, in $Y_{1.4}Gd_{0.6}BiFe_{3.8}Ga_{1.2}O_{12}$, the light transmission through the system 21-23 can be changed by a factor 5 for a change of the external magnetic field outside the transducer by between 0 and 20 Oe, provided that a bias field of 60 Oe is used.

Figure 8:
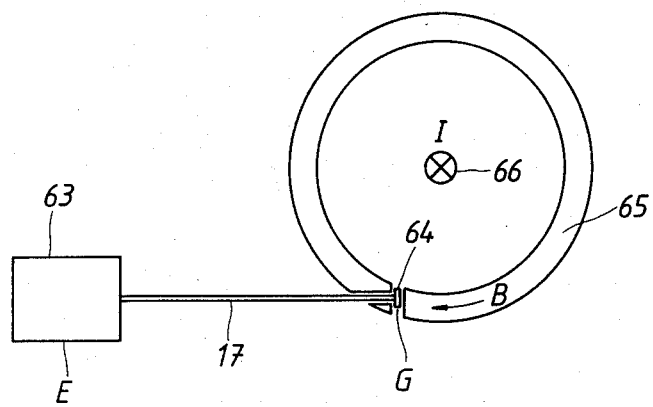
FIG. 8 is a schematic diagram showing how magnetic fields around a conductor, traversed by an electric current, are collected in a ring core.
Figure 9:
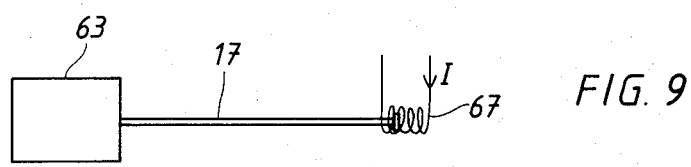
FIG. 9 is a schematic diagram showing how a coil of a desired shape, traversed by an electric current, can calso be used for generating the magnetic field in the transducer of the apparatus of FIG. 1.
Figure 11:
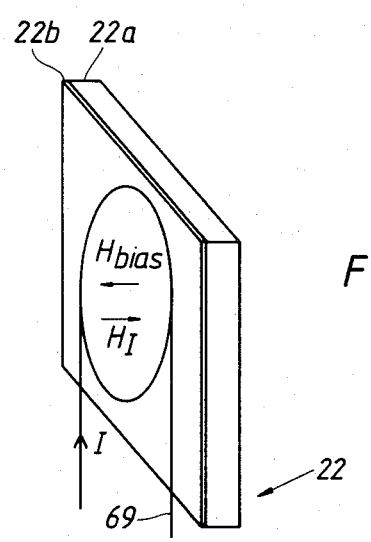
Figure 12A:
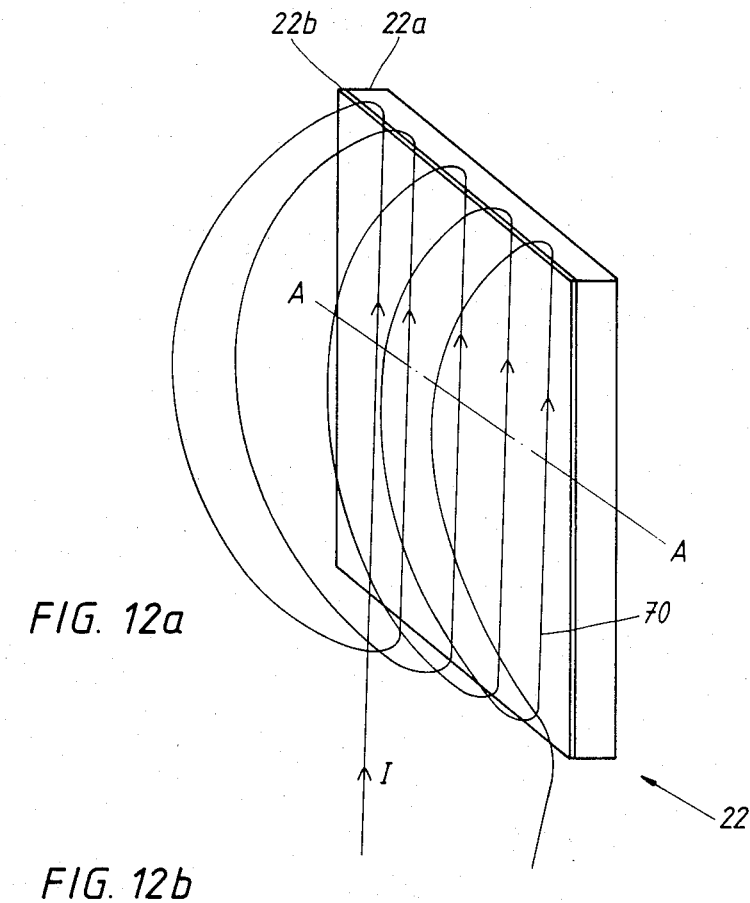
Figure 12B:
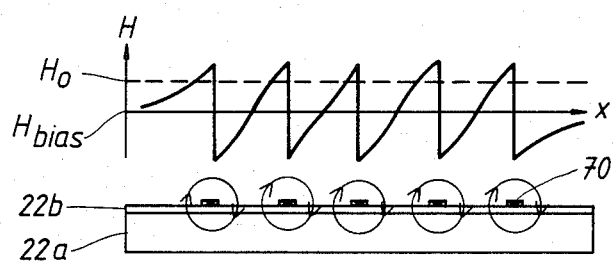

If the magnetic field B is generated by a current I, the measuring system according to FIG. 1 can also be used for current measurement. Thus, FIG. 8 shows how the magnetic field B around a current-traversed conductor 66 is collected in a ring core 65, in which an air gap has been provided for inserting a magnetic field transducer 64. Numeral 17 designates the optical fiber which connects the transducer 64 to a measuring equipment 63 (E). For inserting the fiber 17 into the air gap, a tangential hole has been provided in the ring core 65. A current-traversed coil 67 (see FIG. 9) of a desired configuration may, of course, also be used for generating the magnetic field in the transducer. Instead of generating the magnetic field with an external circuit, as in FIGS. 8 and 9, this can be done with one or more circuits which are integrated with the transducer structure in FIG. 2. How this can be done is clear from FIGS. 11 and 12. In FIG. 11 a current loop 69 has been applied in the same plane as the magneto-optical material 22, the current I thus being added or subtracted, in dependence on its direction, by a field $H_I$ to or from the field $H_{bias}$ produced by the bias magnet 26. The current can also be used for positioning the domains at the surface of the material 22 by applying a conduction pattern directly on the material 22, as illustrated in FIG. 12. In FIG. 12, a number of parallel current paths are laid out, through which the current I is conducted in one and the same direction. This leads to the distribution of the magnetic field according to FIG. 12b, which provides a well-defined dependence between the current I and the magnitude of the domains. By tailoring the layout of the conduction paths to the transmission functions of the optic system, a linear relationship can be obtained between the current I and the detector light.

Figure 10:
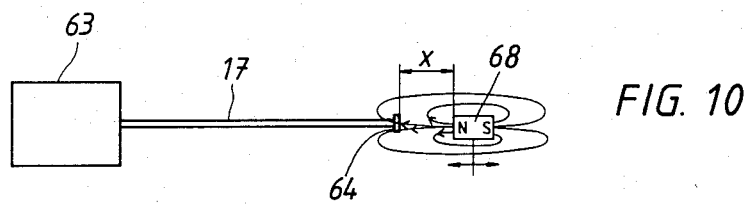
FIG. 10 is a schematic diagram showing how mechanical quantities may be measured using the measuring apparatus of FIG. 1, and FIGS. 11 and 12a and 12b are schematic perspective views showing how one or more current circuits can be integrated with the transducer structure according to FIG. 2.

Finally should be mentioned the possibility of measuring mechanical quantities with the measuring apparatus according to FIG. 1, which is exemplified by FIG. 10 in which the magnetic field at the sensor 64 is modulated by any variation in the distance X to a permanent magnet 68.

What is claimed is:

1. Measuring apparatus, comprising:
    a magneto-optical modulator-type transducer with a domain-producing magnetic material influenced by the characteristic being measured, and including at least one optical filter having a transmission characteristic including that of said transducer, and at least one other optical filter having a transmission characteristic outside that of said transducer;
    at least three radiation sources each having different non-overlapping emission spectra for irradiating said transducer, the emission spectra of a first radiation source being absorbed by said transducer to a greater extent than the radiation from the other of said at least three radiation sources, the radiation from another of said at least three radiation sources being reflected by said transducer, said transducer modulating the radiation from one of said another of said at least three radiation sources to a greater extent than the modulation of the radiation from the remaining of said at least three radiation sources;
    an opto-electronic measuring unit for sensing the radiation emanating from said transducer of said at least three radiation sources and including means for calculating the amount of magneto-optical modulation of said transducer with compensation for varying attenuation and reflection within the measuring apparatus; and
    fiber optical means for transmitting the radiation from said at least three radiation sources to said transducer and for transmitting the radiation emanating from said transducer to said opto-electronic measuring unit.

2. A measuring apparatus according to claim 1, wherein said transducer further includes another filter having a temperature-dependent attenuation within one of the emission spectra of said at least three radiation sources, whereby the temperature dependence of said magneto-optical modulator-type transducer is compensated.

3. A measuring apparatus according to claim 2, wherein said filter with temperature-dependent attenuation has an absorption edge in said emission spectra, the temperature dependence being obtained by the wavelength shift of said absorption edge, induced by the temperature.

4. A measuring apparatus according to claim 2, further comprising a fourth radiation source, having an emission spectrum different from said at least three radiation sources, is used for sensing the temperature of said transducer, said filter with temperature-dependent attenuation being so chosen and so positioned in said transducer that the radiation passing out of said transducer in the wavelength band of said fourth radiation source has a greater temperature dependence than the radiation in the other emission spectra.

5. A measuring apparatus according to claim 1, wherein at least one of said filters is an interference filter.

6. A measuring apparatus according to claim 1 or claim 5, wherein at least two of said filters are dichroic polarizers.

7. A measuring apparatus according to claim 1, wherein
said at least three radiation sources are light-emitting diodes, and
the wavelength separation between their respective emission spectra is obtained by selecting semiconductor diodes having different band gaps in the light emitted semiconductor layer and by placing interference filters between each radiation source and said fiber optical means.

8. A measuring apparatus according to claim 1, wherein the radiation from said at least three radiation sources is measured before reaching said transducer to compensate for differences in the radiation strength between said radiation sources.

9. A measuring apparatus according to claim 8, wherein said measurement is carried out with a transparent photodiode in the radiation path of said optical fiber means.

10. A measuring apparatus according to claim 8, wherein said opto-electronic measuring unit includes a conventional photodetector which senses radiation emanating from said at least one optical fiber via a beam splitter and a branch of an optical fiber.

11. A measuring apparatus according to claim 1, wherein said magneto-optical modulator-type transducer further includes an anisotropic magnetic layer with formed magnetic domains magnetized in two alternative directions, either out from the layer or in towards the layer, the magnetic field influencing said layer having a component perpendicular to the layer, and variations in magnitude of this magnetic field component giving rise to varying magnitude relationships between the magnetic domains which are magnetized in parallel and in anti-parallel, respectively, with said magnetic field component.

12. A measuring apparatus according to claim 11, wherein said varying magnitude relationships between magnetic domains with a magnetization which is parallel to and anti-parallel to the external field are sensed optically by means of two light polarizers, one polarizer being positioned in the radiation path on one side of said magneto-optical modulator and the other polarizer being positioned in the radiation path on the other side of said modulator, the directions of polarization of the polarizers being rotated with respect to each other for detection of the polarization rotation, caused by the magnetic domains, through the Faraday effect.

13. A measuring apparatus according to claim 1, wherein at least one parmanent magnet is provided in said transducer to obtain a bias magnetic field, perpendicular to the surface of the magneto-optical modulator in said magneto-optical modulator-type transducer.

14. A measuring apparatus according to claim 1, wherein the magneto-optical modulator in said transducer is located in the air gap of a magnetic circuit, in which at least one electric current generates a magnetic field.

15. A measuring apparatus according to claim 1, wherein an electric coil is applied on the surface of the modulator of said transducer, whereby the magnetic field, generated by the coil current, perpendicular to a layer of said domain-producing magnetic material produces an optically detectable signal.

16. A measuring apparatus according to claim 1, wherein electric conductors are applied on the surface of said magneto-optical modulator, whereby a field distribution, dependent on the current passing through the conductors, is obtained across said modulator for modulating its magnetic and optical properties.

17. A measuring apparatus according to claim 1, wherein the magneto-optical modulator of said transducer is arranged to be influenced by one or more permanent magnets movable in space.

18. A mesuring apparatus according to claim 1, wherein the surface of the magneto-optical modulator of said transducer is provided with a layer of a ferrofluid.

* * * * *